(12) United States Patent
Lee et al.

(10) Patent No.: US 9,659,647 B1
(45) Date of Patent: May 23, 2017

(54) SYSTEMS AND METHODS FOR PROGRAMMING A MEMORY CELL HAVING A PROGRAMMABLE RESISTANCE

(71) Applicant: Taiwan Semiconductor Manufacturing Company Limited, Hsinchu (TW)

(72) Inventors: Po-Hao Lee, Hsinchu (TW); Chung-Cheng Chou, Hsinchu (TW); Chia-Fu Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/016,478

(22) Filed: Feb. 5, 2016

(51) Int. Cl.
　　*G11C 11/00* (2006.01)
　　*G11C 13/00* (2006.01)
　　*G11C 29/52* (2006.01)

(52) U.S. Cl.
　　CPC .......... *G11C 13/0069* (2013.01); *G11C 29/52* (2013.01); *G11C 2013/0078* (2013.01)

(58) Field of Classification Search
　　CPC ............... G11C 13/0069; G11C 29/52; G11C 2013/0078
　　USPC ....... 365/46, 55, 74, 97, 100, 131, 148, 158, 365/171, 173, 163
　　See application file for complete search history.

(56) References Cited

U.S. PATENT DOCUMENTS

| 9,001,552 | B1 | 4/2015 | Nguyen et al. | |
| 2015/0206582 | A1* | 7/2015 | Lam | G11C 11/5678 365/163 |
| 2016/0049194 | A1* | 2/2016 | Bedeschi | G11C 13/004 365/148 |
| 2016/0118102 | A1* | 4/2016 | Abedifard | G11C 11/16 365/158 |
| 2016/0141028 | A1* | 5/2016 | Guo | G11C 7/062 365/163 |
| 2016/0196876 | A1* | 7/2016 | Lee | G11C 5/063 365/63 |

OTHER PUBLICATIONS

LV, Hangbing, Lian, Wentai, Long, Shibing, Liu, Qi, Li, Yingtao, Wang, Wei, Wang, Yan, Zhang, Sen, Liu, Ming; Voltage Driving or Current Driving: Which is Preferred for RRAM Programming?; International Symposium on VLSI Technology, Systems and Applications (VLSI-TSA); Apr. 2011.

* cited by examiner

*Primary Examiner* — Fernando Hidalgo
(74) *Attorney, Agent, or Firm* — Jones Day

(57) ABSTRACT

A circuit for programming a memory cell having a programmable resistance includes a switch. The circuit is configured to apply a programming voltage to the memory cell when the switch is in a first state. The circuit is configured to apply a programming current to the memory cell when the switch is in a second state. The resistance of the memory cell changes from a first resistance state to a second resistance state based on the application of the programming voltage or the programming current to the memory cell.

20 Claims, 11 Drawing Sheets

SYSTEMS AND METHODS FOR PROGRAMMING A MEMORY CELL HAVING A PROGRAMMABLE RESISTANCE

BACKGROUND

Resistive random-access memory (RRAM), magneto-resistive random-access memory (MRAM), and phase change random-access memory (PCRAM), among others, are being explored as next-generation memory devices. Memory cells based on RRAM, MRAM, and PCRAM technologies have programmable resistances. For example, such memory cells can be programmed to be in a high resistance state or a low resistance state, with the resistance of the memory cell being indicative of a value of a bit of data (e.g., a high resistance state is indicative of a bit value of "1," and a low resistance state is indicative of a bit value of "0," in an example).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
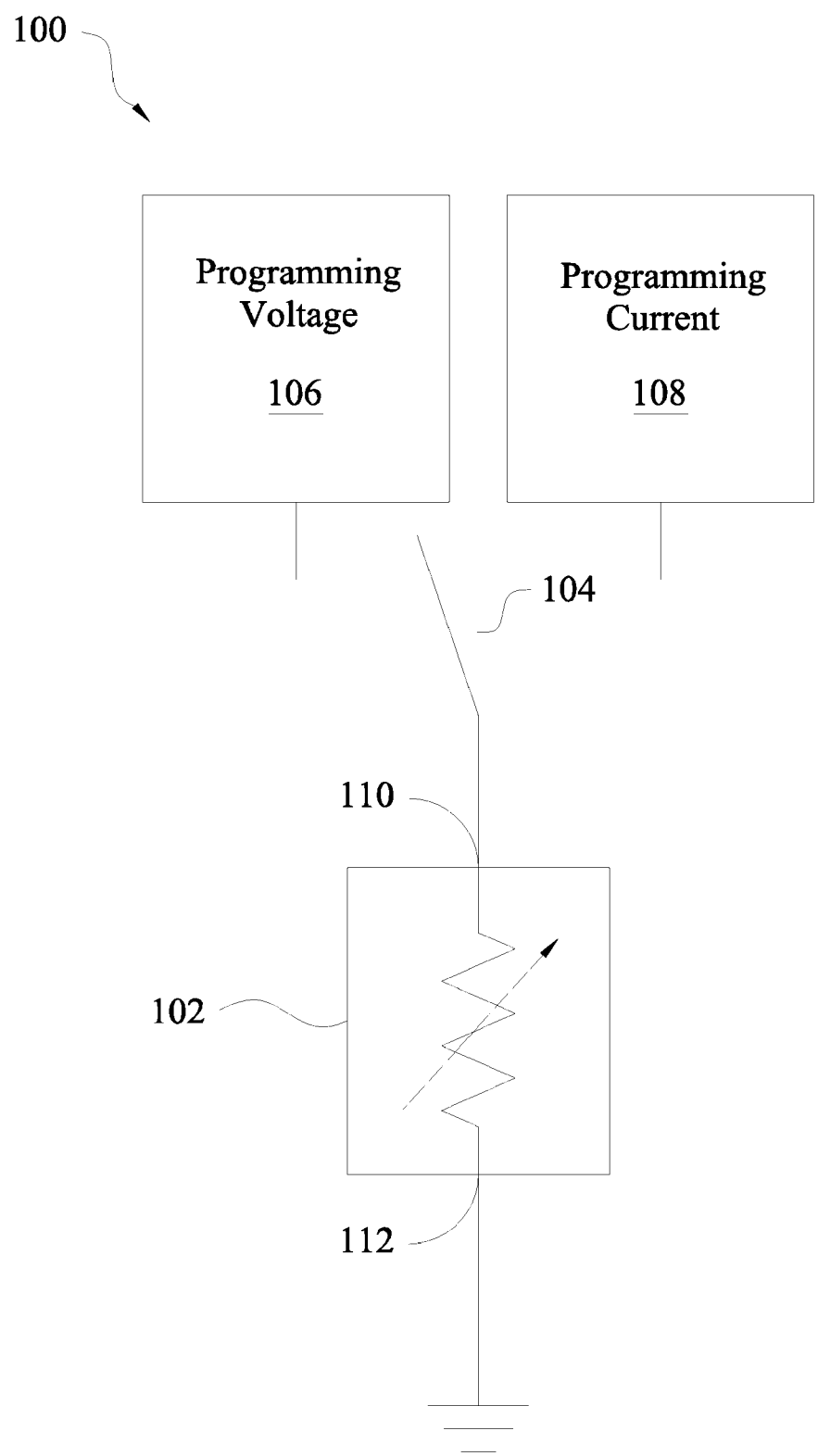
FIG. 1A depicts a block diagram of a circuit configured to program a memory cell having a programmable resistance, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A depicts a block diagram 100 of a circuit configured to program a memory cell 102 having a programmable resistance, in accordance with some embodiments. As shown in the figure, the memory cell 102 includes first and second terminals 110, 112, with the second terminal being connected to a ground reference voltage. Disposed between the terminals 110, 112 of the memory cell 102 is a resistive switching element. The resistive switching element has a programmable resistance, thus enabling the memory cell 102 to be programmed to be in a high resistance state and a low resistance state. The memory cell 102 may be, for example, a resistive random-access memory (RRAM) cell, a magneto-resistive random-access memory (MRAM) cell, or a phase change random-access memory (PCRAM) cell, among other types.

Figure 1B:
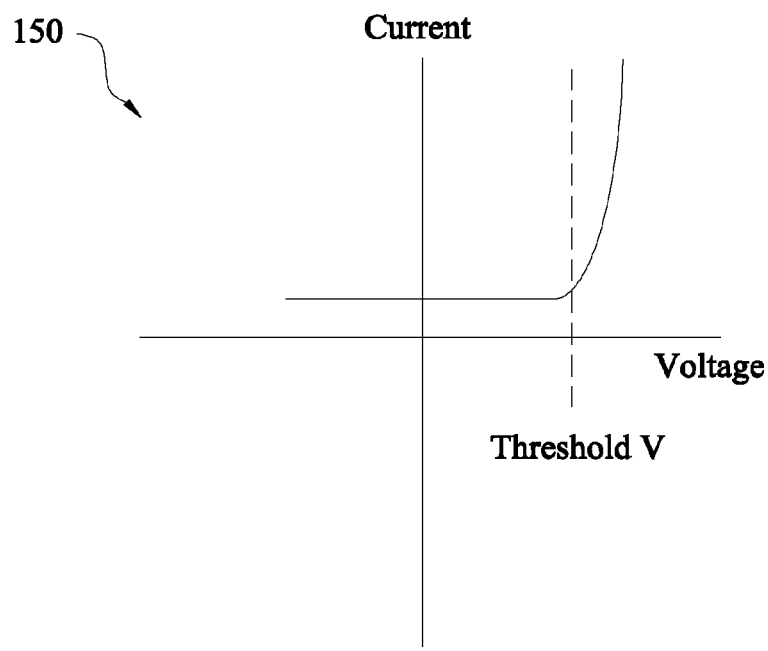
FIGS. 1B and 1C illustrate features of voltage driving and current driving methods of programming a memory cell having a resistive switching element, in accordance with some embodiments.

The resistive switching element of the memory cell 102 has a programmable resistance that varies based on (i) a voltage applied to the cell 102, and (ii) a current flow through the cell 102. For example, as shown in FIG. 1B, when a voltage applied to the memory cell 102 is below a threshold voltage (labeled "Threshold V" in FIG. 1B), no current or very low current flows in the memory cell 102. When the voltage applied to the memory cell 102 is above the threshold voltage, electrical resistance of the memory cell 102 is reduced abruptly, and consequently, a larger current flows in the cell 102. FIG. 1B thus illustrates the application of a programming voltage (e.g., a voltage above the threshold voltage) to the memory cell 102, with the application of the programming voltage changing the resistance of the memory cell 102 from a first resistance state (e.g., high) to a second resistance state (e.g., low). A subsequent application of a programming voltage to the memory cell 102 causes the resistance of the memory cell 102 to change from the second resistance state (e.g., low) to the first resistance state (e.g., high).

It is noted that FIG. 1B and the accompanying description are exemplary only and that the behavior of the memory cell 102 varies in different embodiments. In general, however, the example of FIG. 1B illustrates that the resistance of the memory cell 102 varies between high and low resistance states based on a voltage applied to the memory cell 102. This manner of programming the memory cell 102 is a "voltage driving" method. The memory cell 102 may also be programmed using a "current driving" method. To illustrate features of the current driving method, reference is made to FIG. 1C.

Figure 1C:
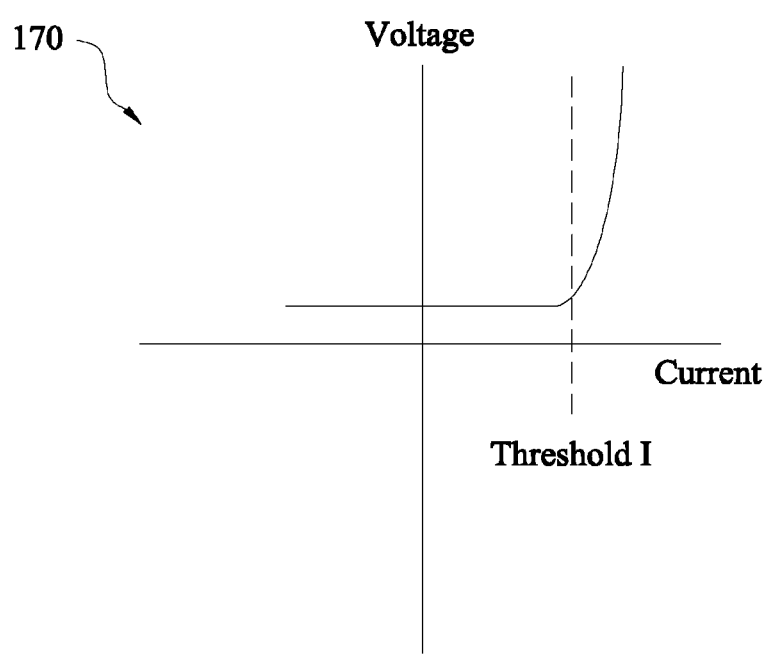

As shown in the example of FIG. 1C, when a current applied to the memory cell 102 is below a threshold current (labeled "Threshold I" in FIG. 1C), a voltage across the memory cell 102 is relatively low. When the current applied to the memory cell 102 is above the threshold current, electrical resistance of the memory cell 102 increases abruptly, and consequently, the voltage across the memory cell 102 increases. FIG. 1C thus illustrates the application of a programming current (e.g., a current above the threshold current) to the memory cell 102, with the application of the programming current changing the resistance of the memory cell 102 from a first resistance state (e.g., low) to a second resistance state (e.g., high). A subsequent application of a programming current to the memory cell 102 causes the resistance of the memory cell 102 to change from the second resistance state (e.g., high) to the first resistance state (e.g., low).

It is noted that FIG. 1C and the accompanying description are exemplary only and that the behavior of the memory cell 102 varies in different embodiments. In general, however, the example of FIG. 1C illustrates that the resistance of the memory cell 102 varies between high and low resistance states based on a current applied to the memory cell 102. This manner of programming the memory cell 102 is the aforementioned current driving method.

With reference again to FIG. 1A, the circuit 100 for programming the memory cell 102 includes a switch 104. The circuit 100 is configured to apply a programming voltage 106 to the memory cell 102 when the switch 104 is in a first state. In an example, the programming voltage 106 is a constant, DC voltage that is above the threshold voltage. The resistance of the memory cell 102 changes from a first resistance state to a second resistance state based on the application of the programming voltage 106 to the memory cell 102, as described above with reference to FIG. 1B. The change in the resistance state from the first resistance state to the second resistance state indicates that the memory cell 102 has been programmed (i.e., that the cell 102 has been written).

The circuit 100 of FIG. 1A is further configured to apply a programming current 108 to the memory cell 102 when the switch 104 is in a second state. In an example, the programming current 108 is a constant current that is above the threshold current. The resistance of the memory cell 102 changes from a first resistance state to a second resistance state based on the application of the programming current 108 to the memory cell 102, as described above with reference to FIG. 1C. The change in the resistance state from the first resistance state to the second resistance state indicates that the memory cell 102 has been programmed.

In conventional systems, a memory cell including a resistive switching element (e.g., a memory cell similar to the cell 102 of FIG. 1A) is programmed using a single method (i.e., the voltage driving method or the current driving method, but not both methods). By contrast, the circuit 100 of FIG. 1A provides a means to program the memory cell 102 using both the voltage driving method and the current driving method. The circuit 100 thus provides a flexible writing scheme for programming the memory cell 102. Different algorithms for programming the memory cell 102 using the voltage and current driving methods are described in further detail below.

Figure 2:
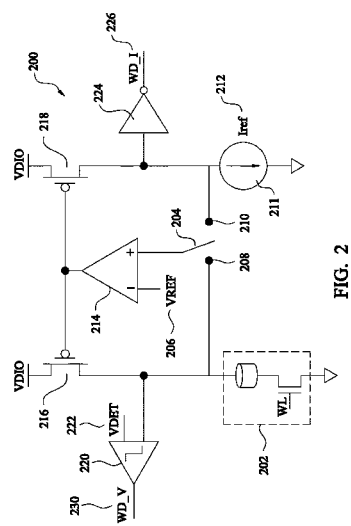
FIG. 2 depicts an example circuit for programming a memory cell having a programmable resistance, in accordance with some embodiments.

FIG. 2 depicts an example circuit 200 for programming a memory cell 202 having a programmable resistance, in accordance with some embodiments. As depicted in the figure, the memory cell 202 includes first and second terminals, with the second terminal being connected to a ground reference voltage. The memory cell 202 of FIG. 2 further includes a transistor structure with source and drain terminals and a gate terminal connected to a wordline. The wordline is used in selecting the memory cell 202 for reading or writing, in an example. The memory cell 202 may be a resistive random-access memory (RRAM) cell, a magneto-resistive random-access memory (MRAM) cell, or a phase change random-access memory (PCRAM) cell, among other types. The memory cell 202 has characteristics similar to those of the memory cell 102 of FIG. 1A, in an example. It is noted that the memory cell 202 of FIG. 2 is exemplary only and that other types of memory cells having programmable resistances are used in other examples. Further, in other examples, the memory cell is not connected to the ground reference voltage, as is illustrated in FIG. 2.

The circuit 200 of FIG. 2 comprises circuitry for programming the memory cell 202. The circuitry includes a switch 204. When the switch 204 is connected to a node 208, the circuitry is configured to apply a programming voltage to the memory cell 202. In the example of FIG. 2, the programming voltage is a VREF voltage 206 received at a first input of a differential amplifier 214 (e.g., an error amplifier or operational amplifier). It should be appreciated that when the switch 204 is connected to the node 208, an output of the differential amplifier 214 changes in a manner that causes a voltage at the node 208 to be equal to the VREF voltage 206. Because a first terminal of the memory cell 202 is coupled to the node 208, the VREF programming voltage 206 is applied to the memory cell 202 under this condition. Because the VREF programming voltage 206 is greater than a threshold voltage needed to program the memory cell 202, the resistance of the memory cell 202 changes from a first resistance state to a second resistance state based on the application of the VREF voltage 206.

When the switch 204 is connected to a node 210, the circuit 200 is configured to apply a programming current to the memory cell 202. In the example of FIG. 2, the programming current is an IREF current 212 generated by a constant current source 211. The circuit 200 includes a left branch including the memory cell 202 and a right branch including the current source 211. It should be appreciated that the circuit 200, as configured in the example of FIG. 2, includes a current mirror that couples the left branch to the right branch, with the current mirror being configured to cause a current flow in the left branch to be copied to the right branch, and vice versa. Thus, when the switch 204 is connected to the node 210, the IREF current 212 is copied from the right branch to the left branch. The copying of the IREF current 212 to the left branch causes the IREF current 212 to be applied to the memory cell 202 as the programming current. Because the IREF current 212 is greater than a threshold current needed to program the memory cell 202, the resistance of the memory cell 202 changes from a first resistance state to a second resistance state based on the application of the IREF current 212.

It is noted that the circuit 200 of FIG. 2 provides a means to program the memory cell 202 using both the voltage driving method and the current driving method. This is in contrast to conventional systems, which permit a memory cell to be programmed using only a single method (e.g., the voltage driving method or the current driving method, but not both). The circuit 200 thus provides a flexible writing scheme that is in contrast to the conventional systems described above.

As is further illustrated in FIG. 2, the circuit 200 includes a first PMOS transistor 216 having a source terminal connected to a power supply voltage ("VDIO"), a gate terminal connected to the single-ended output of the error amplifier 214, and a drain terminal connected to the first terminal of the memory cell 202. The circuit 200 also includes a voltage comparator 220 having a first input configured to receive a VDET reference voltage 222 and a second input connected to the first terminal of the memory cell 202. As described in further detail below, the voltage comparator 220 is used in detecting a completion of a programming operation when the switch 204 is connected to the node 210.

In the right branch, the current source 211 is configured to generate the IREF current 212, as noted above. The right branch also includes a second PMOS transistor 218 having a source terminal connected to the power supply voltage, a gate terminal connected to the single-ended output of the error amplifier 214, and a drain terminal connected to the current source 211. An inverter 224 has an input connected to the drain terminal of the second PMOS transistor 218. As described in further detail below, the right branch of the circuit 200 including the inverter 224 is configured to operate as a current comparator. As described in further detail below, the current comparator is used in detecting a completion of a programming operation when the switch 204 is connected to the node 208.

When the switch 204 is connected to the node 208, the current comparator is configured to (i) compare the current flowing in the memory cell 202 to the IREF current 212, and (ii) generate an output based on the comparison, the output indicating whether the memory cell 202 has been programmed. Conversely, when the switch 204 is connected to the node 210, the voltage comparator 220 is configured to (i) compare the voltage applied to the memory cell 202 to the VDET voltage 222, and (ii) generate an output based on the comparison, the output indicating whether the memory cell 202 has been programmed. The use of the current and voltage comparators for write detection is described in further detail below.

Figure 3A:
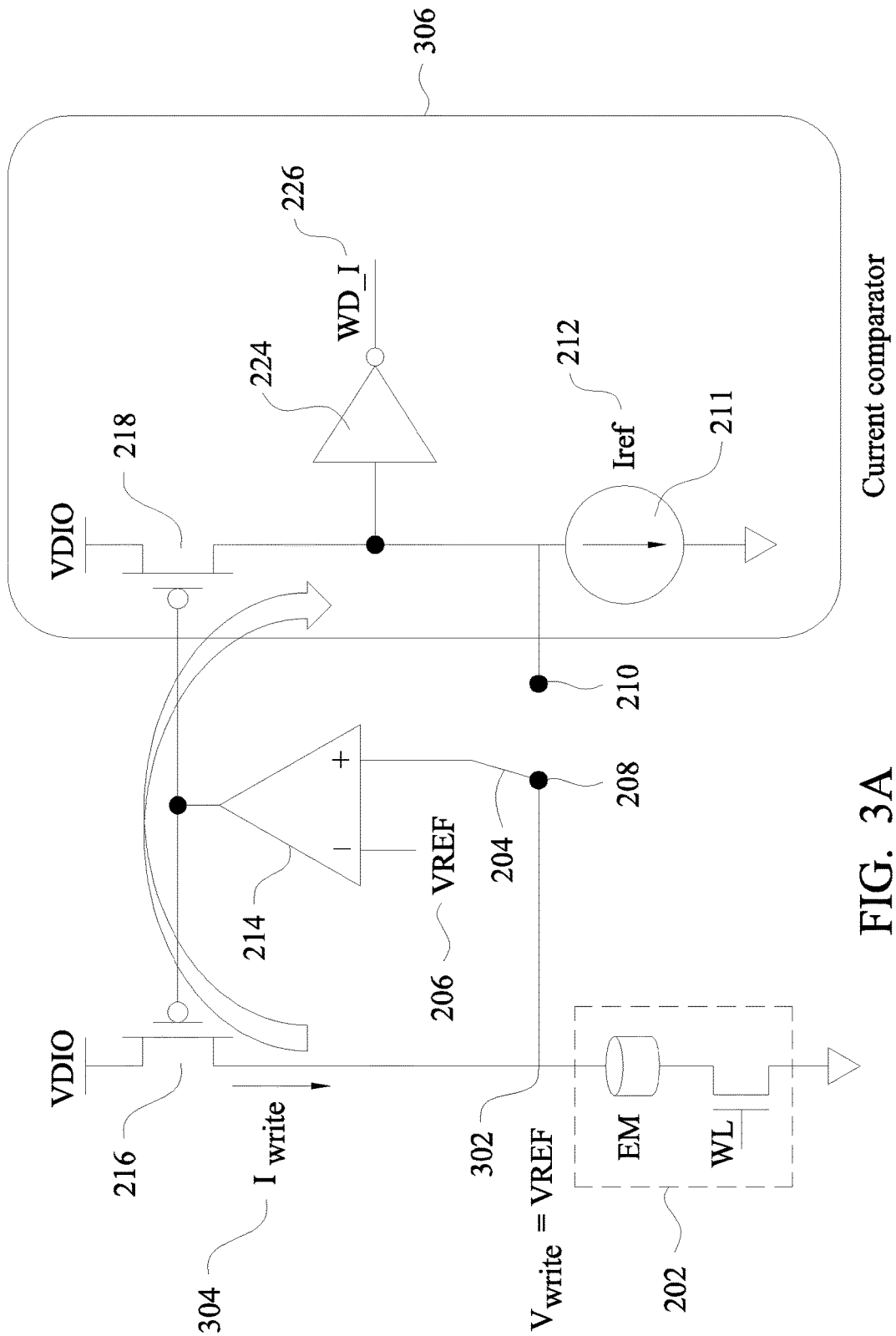
FIGS. 3A and 3B illustrate an operation of the circuit of FIG. 2 when the switch is in a first state, in accordance with some embodiments.

As explained above, when the switch 204 is coupled to the node 208, the circuit 200 is configured to apply a programming voltage to the memory cell 202. To further illustrate the operation of the circuit 200 when the switch 204 is coupled to the node 208, reference is made to FIG. 3A. With respect to the embodiment of FIG. 2, like elements in the embodiment of FIG. 3A are designated with the same reference numbers for ease of understanding. In FIG. 3A, the switch 204 is coupled to the node 208, which causes a voltage at the node 302 to be equal to the VREF voltage 206. Because a first terminal of the memory cell 202 is coupled to the node 302, the VREF programming voltage 206 is applied to the memory cell 202 under this condition. Because the VREF programming voltage 206 is greater than a threshold voltage needed to program the memory cell 202, the resistance of the memory cell 202 changes from a first resistance state to a second resistance state based on the application of the VREF voltage 206. In an example, the VREF voltage 206 is a DC, constant voltage. The memory cell 202 is labeled "EM" in the example of FIG. 3A, denoting that it comprises a type of "emerging memory" (e.g., RRAM, MRAM, PCRAM, etc.).

Figure 3B:
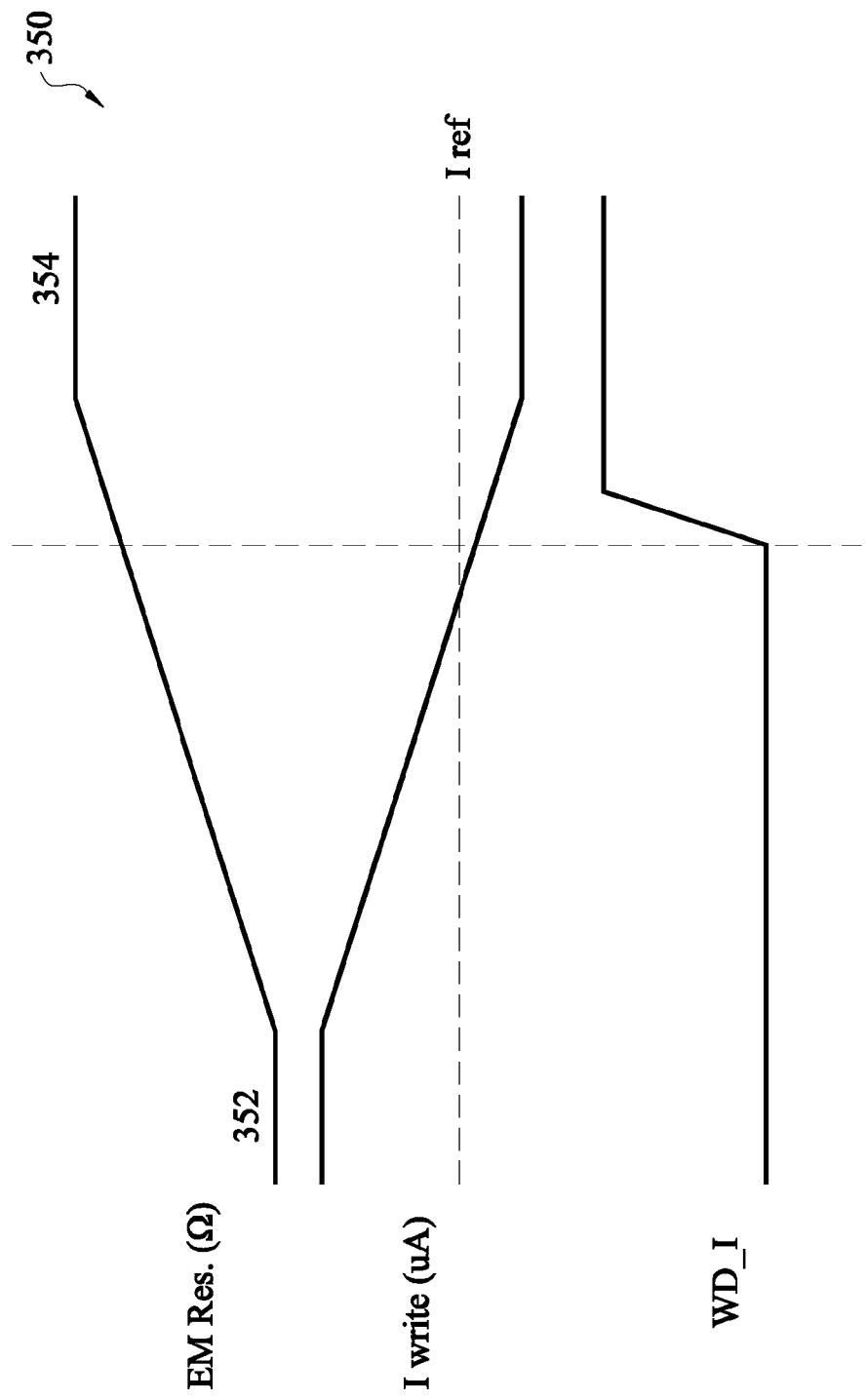

To illustrate the resistance of the memory cell 202 changing from the first resistance state to the second resistance state based on the application of the VREF programming voltage 206, reference is made to FIG. 3B. This figure includes a graph of the resistance of the memory cell 202 (labeled "EM Res." in FIG. 3B). An x-axis of the graphs depicted in FIG. 3B represents time. Initially, in the example of FIG. 3B, the memory cell 202 has a first resistance state 352 that is a low resistance state. Upon application of the VREF programming voltage 206 to the memory cell 202, the resistance of the memory cell 202 changes to a second resistance state 354 that is a high resistance state. The reason for the change in resistance states upon the application of the programming voltage is explained above with reference to FIG. 1B.

As a result of the resistance of the memory cell 202 changing upon the application of the VREF programming voltage 206, a current flowing in the memory cell 202 also changes. The current flowing in the memory cell 202 is the Iwrite current 304 illustrated in FIG. 3A. In the example of FIGS. 3A and 3B, the application of the VREF programming voltage 206 to the memory cell 202 causes the Iwrite current 304 to decrease. In other words, as the resistance of the memory cell 202 increases due to the application of the VREF programming voltage 206 to the memory cell 202, the Iwrite current 304 through the cell 202 decreases accordingly. This reduction of the Iwrite current 304 is illustrated in FIG. 3B.

As described above with reference to FIG. 2, the PMOS transistors 216, 218 and other portions of the circuit are connected in a manner that implements a current mirror. When the switch 204 is connected to the node 208, the current mirror copies the Iwrite current 304 flowing in the memory cell 202 from the left branch of the circuit to the right branch of the circuit. As illustrated in the figure, the right branch is configured to act as a current comparator 306. The current comparator 306 is configured to (i) compare the Iwrite current 304 flowing in the memory cell 202 to the IREF current 212, and (ii) generate an output 226 based on the comparison. The output 226 indicates whether the memory cell 202 has been programmed. In an example, the circuit is configured to terminate the application of the VREF programming voltage 206 to the memory cell 202 based on the output 226 of the current comparator 306.

To implement the current comparator 306, the circuit includes the inverter 224. The inverter 224 generates the output 226 that is low (e.g., a logic level low output) when the Iwrite current 304 is greater than the IREF current 212. When the Iwrite current 304 is less than the IREF current 212, the inverter 224 generates the output 226 that is high (e.g., a logic level high output). This behavior of the output 226 of the inverter 224 (labeled "WD_I") is illustrated in FIG. 3B, which shows that the WD_I output 226 goes high only after the Iwrite current 304 is less than the IREF current 212. In this example, the output 226 of the inverter 224 indicates that the memory cell 202 has been programmed and that the application of the VREF programming voltage 206 to the memory cell 202 should be terminated.

From the description of FIGS. 3A and 3B above, it should be appreciated that when the switch 204 is connected to the node 208, (i) the memory cell 202 is written with the constant VREF voltage 206, and (ii) writing of the memory cell 202 is detected based on a comparison of the Iwrite current 304 and the IREF current 212. The example of FIGS. 3A and 3B may be understood as implementing a "reset" writing operation, with the reset operation causing the resistance of the memory cell 202 to change from the low resistance state 352 to the high resistance state 354 based on the application of the VREF programming voltage 206.

It is noted that the application of the VREF programming voltage 206 to the memory cell 202 may also be used to implement a "set" writing operation. The set operation causes the resistance of the memory cell 202 to change from the high resistance state 354 to the low resistance state 352. In the set operation, when the resistance of the memory cell 202 is in the high resistance state 354, the Iwrite current 304 has a relatively low value. The application of the VREF programming voltage 206 to the memory cell 202 causes the resistance of the memory cell 202 to change to the low resistance state 352. The Iwrite current 304 increases accordingly. When the Iwrite current 304 surpasses the IREF current 212, the WD_I output 226 of the inverter 224 changes from a high value (e.g., a logic level high value) to a low value (e.g., a logic level low value), indicating that the set operation is complete and that the application of the VREF programming voltage 206 to the memory cell 202 should be terminated. It is noted that a value of the IREF current 212 varies based on whether a reset or set operation is being implemented. In the example of FIG. 3A, the IREF current 212 is set to a higher value when implementing the set operation (i.e., in order to detect the change of the Iwrite current 304 from the low value to the high value), and the IREF current 212 is set to a lower value when implementing the reset operation (i.e., in order to detect the change of the Iwrite current 304 from the high value to the low value).

Figure 4A:
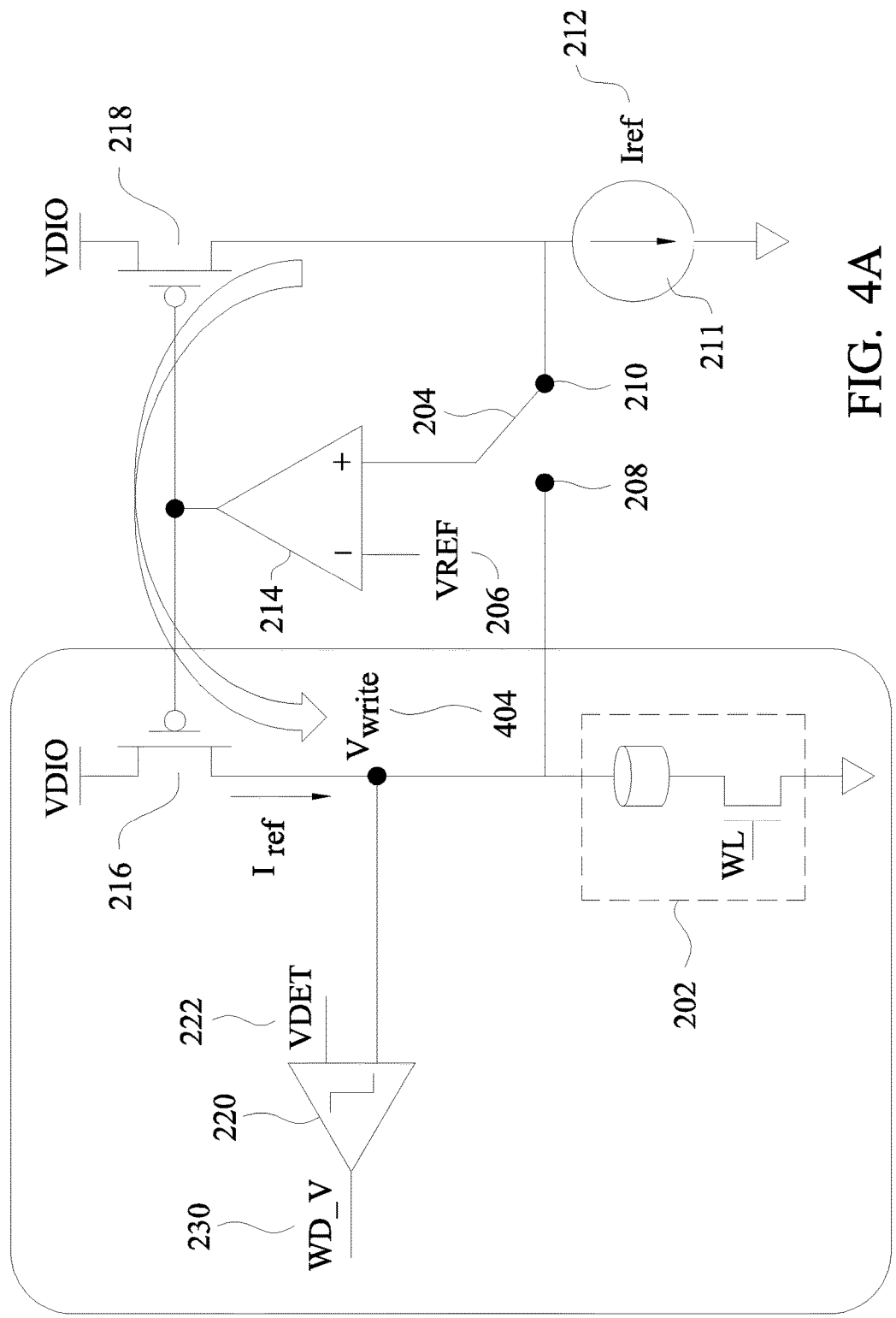
FIGS. 4A and 4B illustrate an operation of the circuit of FIG. 2 when the switch is in a second state, in accordance with some embodiments.

As explained above, when the switch 204 is coupled to the node 210, the circuit 200 is configured to apply a programming current to the memory cell 202. To further illustrate the operation of the circuit 200 when the switch 204 is coupled to the node 210, reference is made to FIG. 4A. With respect to the embodiment of FIG. 2, like elements in the embodiment of FIG. 4A are designated with the same reference numbers for ease of understanding. As shown in FIG. 4A, when the switch 204 is coupled to the node 210, the IREF current 212 is copied from the right branch to the left branch. The copying of the IREF current 212 to the left branch causes the IREF current 212 to be applied to the memory cell 202 as the programming current. Because the IREF current 212 is greater than a threshold current needed to program the memory cell 202, the resistance of the memory cell 202 changes from a first resistance state to a second resistance state based on the application of the IREF current 212. In an example, the IREF current 212 is a constant current.

Figure 4B:
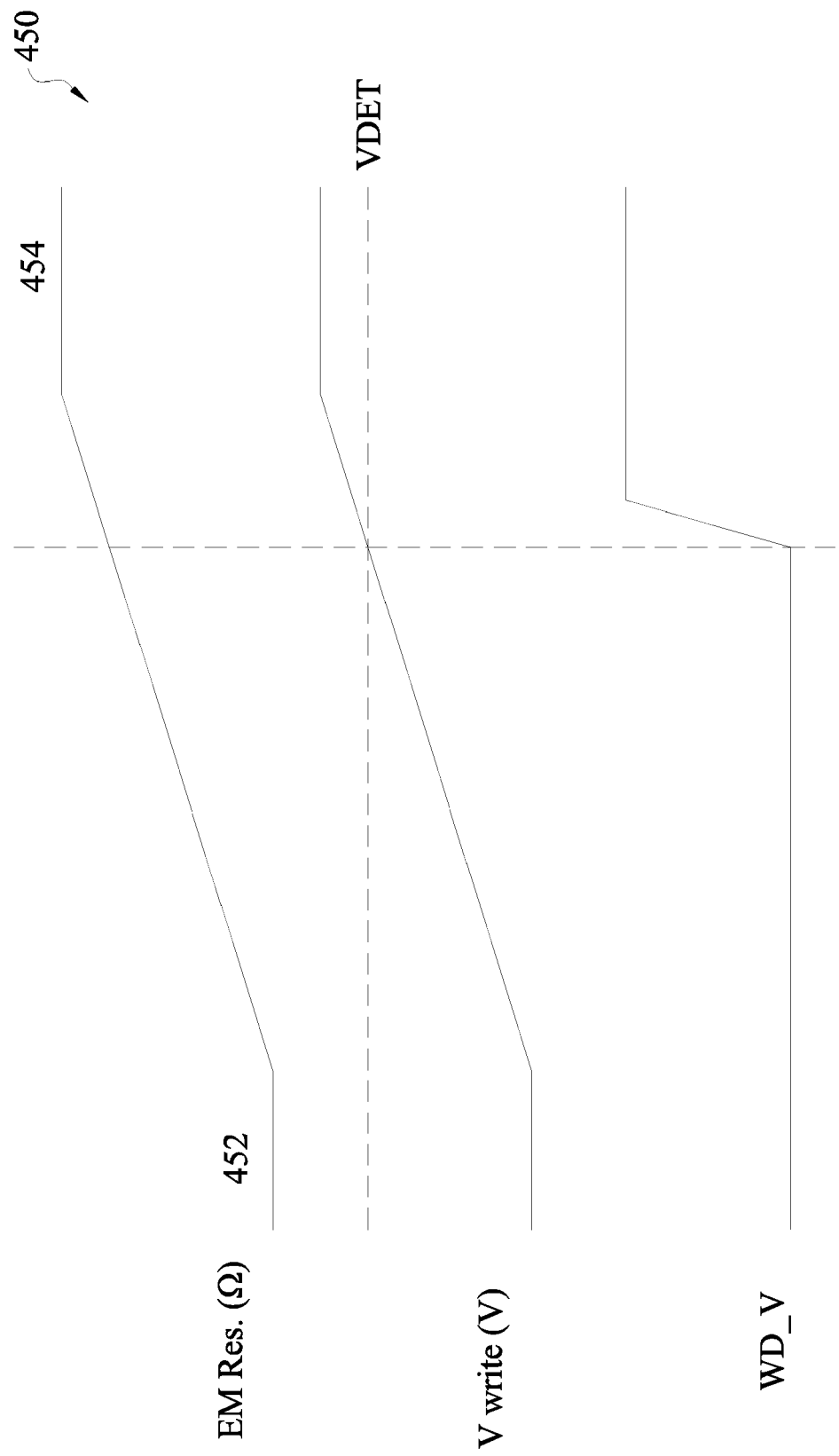

To illustrate the resistance of the memory cell 202 changing from the first resistance state to the second resistance state based on the application of the IREF programming current 212, reference is made to FIG. 4B. This figure includes a graph of the resistance of the memory cell 202 (labeled "EM Res." in FIG. 4B). An x-axis of the graphs depicted in FIG. 4B represents time. Initially, in the example of FIG. 4B, the memory cell 202 has a first resistance state 452 that is a low resistance state. Upon application of the IREF programming current 212 to the memory cell 202, the resistance of the memory cell 202 changes to a second resistance state 454 that is a high resistance state. The reason for the change in resistance states upon the application of the programming current is explained above with reference to FIG. 1C.

As a result of the resistance of the memory cell 202 changing upon the application of the IREF programming current 212, a voltage applied to the memory cell 202 also changes. The voltage applied to the memory cell 202 is the Vwrite voltage 404 illustrated in FIG. 4A. In the example of FIGS. 4A and 4B, the application of the IREF programming current 212 to the memory cell 202 causes the Vwrite voltage 404 to increase. In other words, as the resistance of the memory cell 202 increases due to the application of the IREF programming current 212 to the memory cell 202, the Vwrite voltage 404 applied to the cell 202 increases accordingly. This increase of the Vwrite voltage 404 is illustrated in FIG. 4B.

As illustrated in FIG. 4A, the left branch of the circuit includes a voltage comparator 220. The voltage comparator 220 is configured to (i) compare the Vwrite voltage 404 applied to the memory cell 202 to the VDET voltage 222, and (ii) generate an output 230 (labeled "WD_V") based on the comparison. The output 230 indicates whether the memory cell 202 has been programmed. In an example, the circuit is configured to terminate the application of the IREF programming current 212 to the memory cell 202 based on the output 230 of the voltage comparator 220. As shown in the figure, the voltage comparator 220 has a first input configured to receive the VDET voltage 222 and a second input connected to the first terminal of the memory cell 202. The voltage comparator 220 generates the output 230 that is low (e.g., a logic level low output) when the Vwrite voltage 404 is less than the VDET voltage 222. When the Vwrite voltage 404 is greater than the VDET voltage 222, the output 230 of the voltage comparator 220 is high (e.g., a logic level high value). This behavior of the output 230 of the voltage comparator 220 is illustrated in FIG. 4B, which shows that the WD_V output 230 goes high only after the Vwrite voltage 404 is greater than the VDET voltage 222. In this example, the output 230 of the voltage comparator 220 indicates that the memory cell 202 has been programmed and that the application of the IREF programming current 212 to the memory cell 202 should be terminated.

From the description of FIGS. 4A and 4B, it should be appreciated that when the switch 204 is connected to the node 210, (i) the memory cell 202 is written with the constant IREF current 212, and (ii) writing of the memory cell 202 is detected based on a comparison of the Vwrite voltage 404 and the VDET voltage 222. The example of FIGS. 4A and 4B may be understood as implementing a "reset" writing operation, with the reset operation causing the resistance of the memory cell 202 to change from the low resistance state 452 to the high resistance state 454 based on the application of the IREF programming current 212.

It should be appreciated that the application of the IREF programming current 212 to the memory cell 202 may also be used to implement a "set" writing operation. The set operation causes the resistance of the memory cell 202 to change from the high resistance state 454 to the low resistance state 452. In the set operation, when the resistance of the memory cell 202 is in the high resistance state 454, the Vwrite voltage 404 has a relatively high value. The application of the IREF programming current 212 to the memory cell 202 causes the resistance of the memory cell 202 to change to the low resistance state 452. The Vwrite voltage 404 decreases accordingly. When the Vwrite voltage 404 is less than the VDET voltage 222, the WD_V output 230 of the voltage comparator 220 changes from a high value (e.g., a logic level high value) to a low value (e.g., a logic level low value), indicating that the set operation is complete and that the application of the IREF programming current 212 to the memory cell 202 should be terminated. It is noted that a value of the VDET voltage 222 varies based on whether a reset or set operation is being implemented. In the example of FIG. 4A, the VDET voltage 222 is set to a lower value when implementing the set operation (i.e., in order to detect the change of the Vwrite voltage 404 from the high value to the low value), and the VDET voltage 222 is set to a higher value when implementing the reset operation (i.e., in order to detect the change of the Vwrite voltage 404 from the low value to the high value).

The capability to program the memory cell 202 using both the voltage driving mode and the current driving mode provides a flexible scheme for writing the memory cell 202. For example, using the approaches described herein, a "reset" writing operation may be performed using the voltage driving mode, and a "set" writing operation may be performed using the current driving mode, and vice versa. Additionally, the approaches described herein enable the voltage and current driving modes to be compared and studied.

Figure 5:
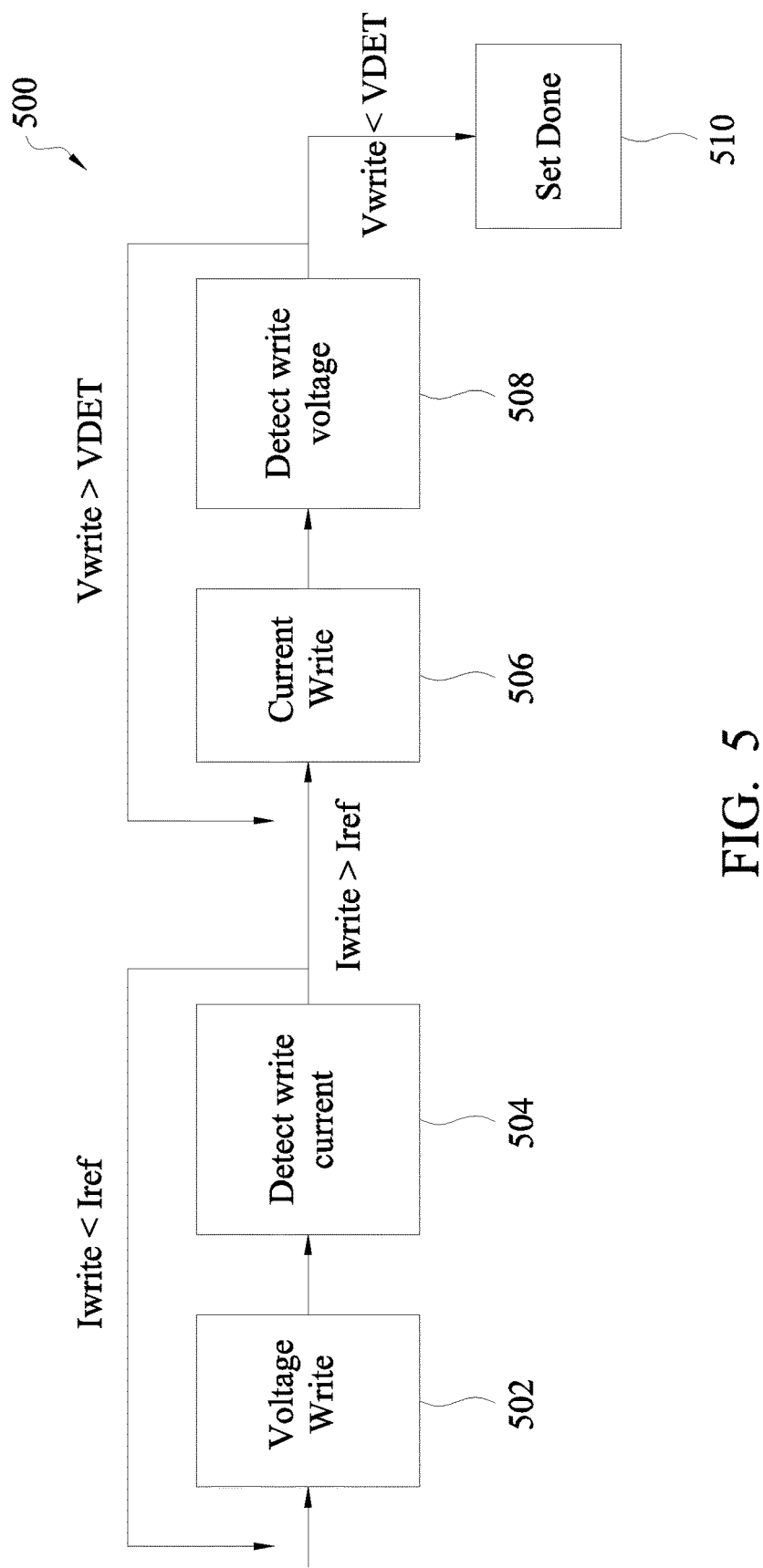
FIG. 5 illustrates an algorithm that uses both voltage and current driving modes for performing a set operation, in accordance with some embodiments.

The flexible scheme for writing a memory cell having a resistive switching element described herein further enables set and reset operations to be performed using a combination of the voltage and current driving modes. FIG. 5 illustrates an algorithm 500 that uses both voltage and current driving modes for performing a set operation, in accordance with some embodiments. In this figure, at 502, a constant voltage is applied to the memory cell, as described above with reference to FIG. 3A. At 504, a current comparator compares a current flowing through the memory cell (Iwrite) to a reference current (IREF), as is described above with reference to FIG. 3A. The constant voltage is applied while Iwrite is less than IREF, as illustrated in FIG. 5. When Iwrite is greater than IREF, the application of the constant voltage to the memory cell is terminated, thus ending the voltage driving portion of the set operation.

At this point in the algorithm 500 of FIG. 5, the current driving portion of the set operation starts. At 506, a constant current is applied to the memory cell, as described above with reference to FIG. 4A. At 508, a voltage comparator compares a voltage applied to the memory cell (Vwrite) to a reference voltage (VDET), as is described above with reference to FIG. 4A. The constant current is applied while Vwrite is greater than VDET, as illustrated in FIG. 5. When Vwrite is less than VDET, the application of the constant current to the memory cell is terminated, thus completing the set operation at 510. In other examples, an algorithm for performing the set operation starts utilizes the current driving mode first and the voltage driving mode second.

Figure 6:
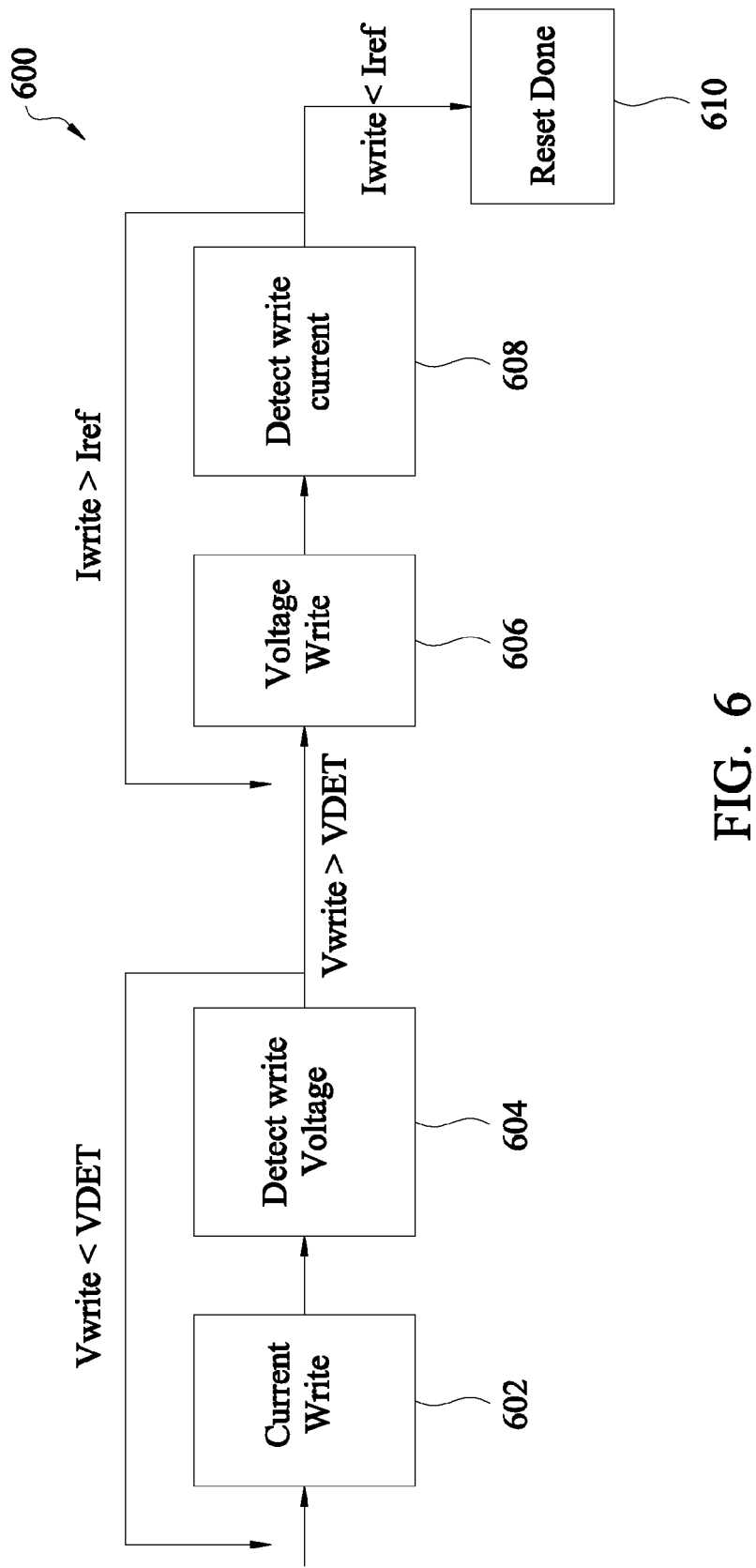
FIG. 6 illustrates an algorithm that uses both voltage and current driving modes for performing a reset operation, in accordance with some embodiments.

FIG. 6 illustrates an algorithm 600 that uses both voltage and current driving modes for performing a reset operation, in accordance with some embodiments. In this figure, at 602, a constant current is applied to the memory cell, as described above with reference to FIG. 4A. At 604, a voltage comparator compares a voltage applied to the memory cell (Vwrite) to a reference voltage (VDET), as is described above with reference to FIG. 4A. The constant current is applied while Vwrite is less than VDET, as illustrated in FIG. 6. When Vwrite is greater than VDET, the application of the constant current to the memory cell is terminated, thus ending the current driving portion of the reset operation.

At this point in the algorithm 600 of FIG. 6, the voltage driving portion of the reset operation starts. At 606, a constant voltage is applied to the memory cell, as described above with reference to FIG. 3A. At 608, a current comparator compares a current flowing through the memory cell (Iwrite) to a reference current (IREF), as is described above with reference to FIG. 3A. The voltage current is applied while Iwrite is greater than IREF, as illustrated in FIG. 6. When Iwrite is less than IREF, the application of the constant voltage to the memory cell is terminated, thus completing the reset operation at 610. In other examples, an algorithm for performing the reset operation starts utilizes the voltage driving mode first and the current driving mode second.

Figure 7:
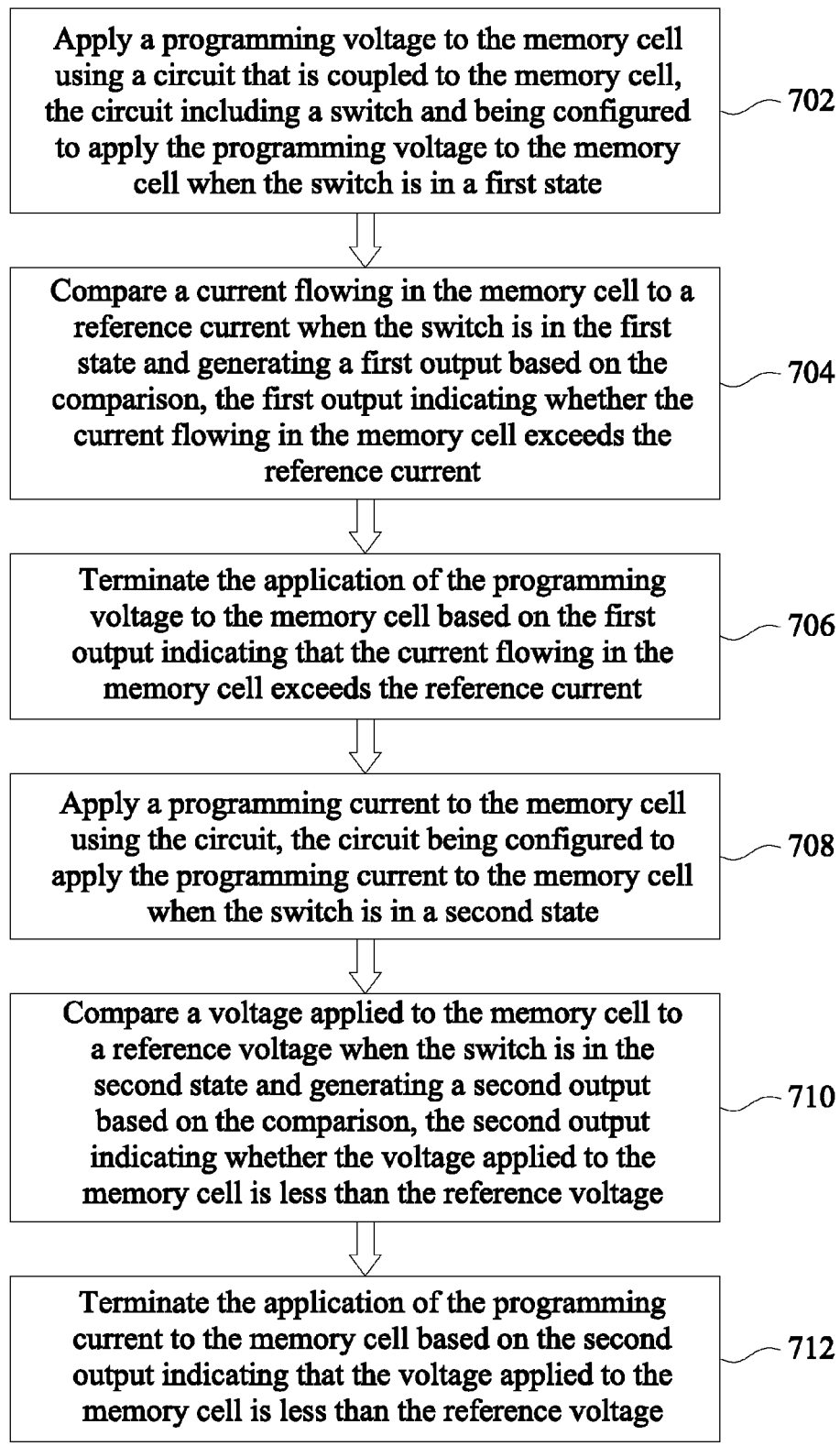
FIG. 7 is a flowchart illustrating an example method of performing a "set" programming operation on a memory cell having a programmable resistance, in accordance with some embodiments.

FIG. 7 is a flowchart illustrating an example method of performing a "set" programming operation on a memory cell having a programmable resistance, in accordance with some embodiments. At 702, a programming voltage is applied to the memory cell using a circuit that is coupled to the memory cell. The circuit includes a switch and is configured to apply the programming voltage to the memory cell when the switch is in a first state. At 704, a current flowing in the memory cell is compared to a reference current when the switch is in the first state, and a first output is generated based on the comparison. The first output indicates whether the current flowing in the memory cell exceeds the reference current. At 706, the application of the programming voltage to the memory cell is terminated based on the first output indicating that the current flowing in the memory cell exceeds the reference current. At 708, a programming current is applied to the memory cell using the circuit. The circuit is configured to apply the programming current to the memory cell when the switch is in a second state. At 710, a voltage applied to the memory cell is compared to a reference voltage when the switch is in the second state, and a second output is generated based on the comparison. The second output indicates whether the voltage applied to the memory cell is less than the reference voltage. At 712, the application of the programming current to the memory cell is terminated based on the second output indicating that the voltage applied to the memory cell is less than the reference voltage.

Figure 8:
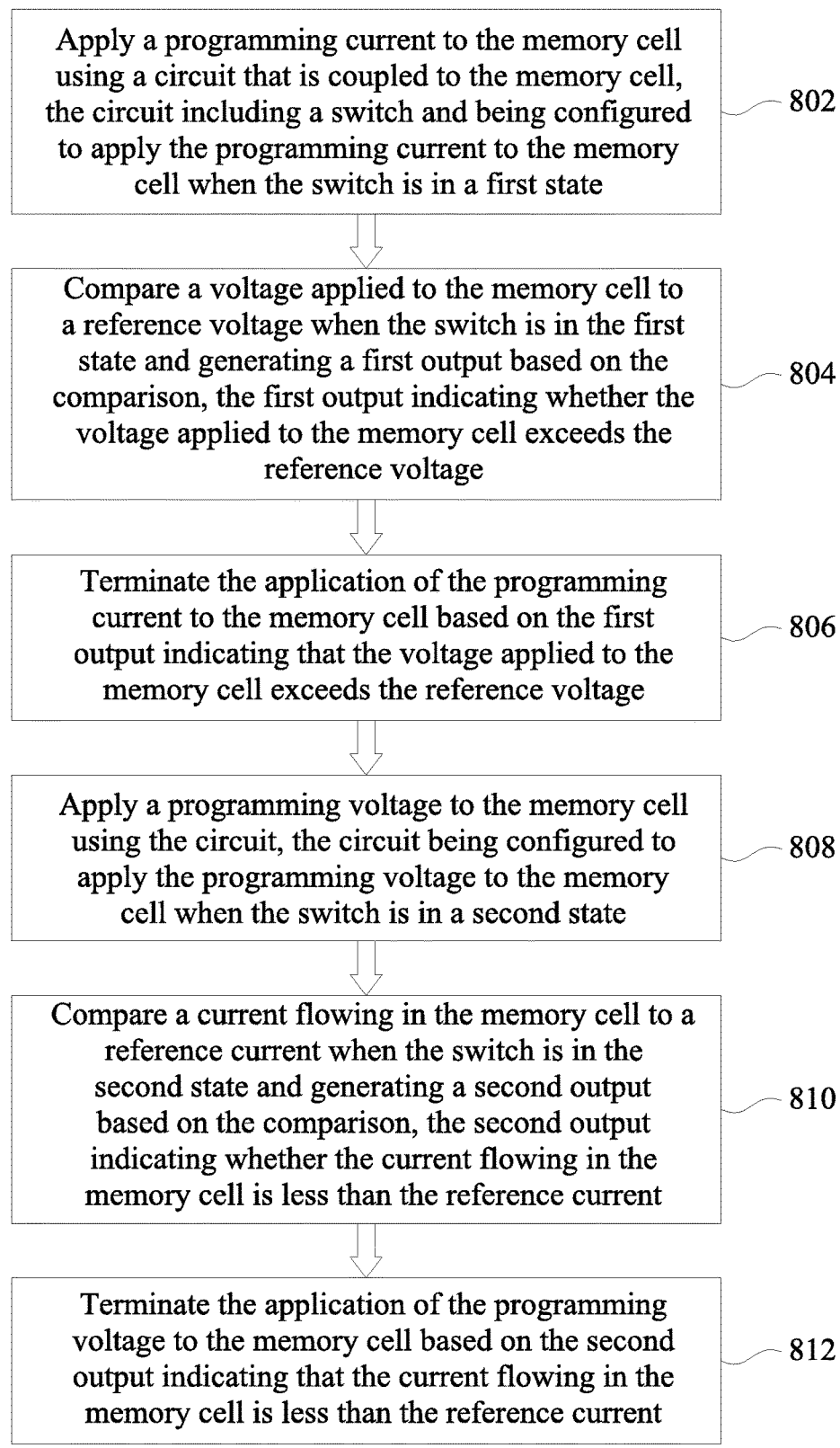
FIG. 8 is a flowchart illustrating an example method of performing a "reset" programming operation on a memory cell having a programmable resistance, in accordance with some embodiments.

FIG. 8 is a flowchart illustrating an example method of performing a "reset" programming operation on a memory cell having a programmable resistance, in accordance with some embodiments. At 802, a programming current is applied to the memory cell using a circuit that is coupled to the memory cell. The circuit includes a switch and is configured to apply the programming current to the memory cell when the switch is in a first state. At 804, a voltage applied to the memory cell is compared to a reference voltage when the switch is in the first state, and a first output is generated based on the comparison. The first output indicates whether the voltage applied to the memory cell exceeds the reference voltage. At 806, the application of the programming current to the memory cell is terminated based on the first output indicating that the voltage applied to the memory cell exceeds the reference voltage. At 808, a programming voltage is applied to the memory cell using the circuit. The circuit is configured to apply the programming voltage to the memory cell when the switch is in a second state. At 810, a current flowing in the memory cell is compared to a reference current when the switch is in the second state, and a second output is generated based on the comparison. The second output indicates whether the current flowing in the memory cell is less than the reference current. At 812, the application of the programming voltage to the memory cell is terminated based on the second output indicating that the current flowing in the memory cell is less than the reference current.

The present disclosure is directed to systems and methods for programming a memory cell (e.g., an RRAM, MRAM, PCRAM memory cell, etc.) having a programmable resistance. As described above, rather than utilize a single method of programming the memory cell (e.g., a voltage driving method or a current driving method), the systems and methods described herein enable the memory cell to be programmed using both the voltage driving method and the current driving method. The approaches described herein thus provide a flexible writing scheme for programming the memory cell that is not achievable in conventional systems and methods.

The present disclosure is directed to a circuit for programming a memory cell having a programmable resistance. An embodiment of the circuit includes a switch. The circuit is configured to apply a programming voltage to the memory cell when the switch is in a first state. The circuit is configured to apply a programming current to the memory cell when the switch is in a second state. The resistance of the memory cell changes from a first resistance state to a second resistance state based on the application of the programming voltage or the programming current to the memory cell.

In another embodiment, a circuit comprises a memory cell including a resistive switching element, the resistive switching element having a programmable resistance. Circuitry coupled to the memory cell includes a switch. The circuitry is configured to apply a voltage to the memory cell when the switch is in a first state, and the circuitry is configured to apply a current to the memory cell when the switch is in a second state. The resistance of the resistive switching element changes from a first resistance state to a second resistance state based on the application of the voltage or the current to the memory cell.

In another embodiment, in a method of programming a memory cell having a programmable resistance, a programming voltage is applied to the memory cell using a circuit that is coupled to the memory cell. The circuit includes a switch and is configured to apply the programming voltage to the memory cell when the switch is in a first state. A current flowing in the memory cell is compared to a reference current when the switch is in the first state, and a first output is generated based on the comparison. The first output indicates whether the current flowing in the memory cell exceeds the reference current. The application of the programming voltage to the memory cell is terminated based on the first output indicating that the current flowing in the memory cell exceeds the reference current. A programming current is applied to the memory cell using the circuit. The circuit is configured to apply the programming current to the memory cell when the switch is in a second state. A voltage applied to the memory cell is compared to a reference voltage when the switch is in the second state, and a second output is generated based on the comparison. The second output indicates whether the voltage applied to the memory cell is less than the reference voltage. The application of the programming current to the memory cell is terminated based on the second output indicating that the voltage applied to the memory cell is less than the reference voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
    a memory cell having a programmable resistance; and
    circuitry coupled to the memory cell and including a switch, the circuitry being configured to apply a programming voltage to the memory cell when the switch is in a first state, and the circuitry being configured to apply a programming current to the memory cell when the switch is in a second state, the resistance of the memory cell changing from a first resistance state to a second resistance state based on the application of the programming voltage or the programming current to the memory cell.

2. The circuit of claim 1, wherein a current flowing in the memory cell changes based on the application of the programming voltage to the memory cell, the circuit further comprising:
    a current comparator configured to (i) compare the current flowing in the memory cell to a reference current, and (ii) generate an output based on the comparison, the output indicating whether the memory cell has been programmed.

3. The circuit of claim 2, wherein the circuitry is configured to terminate the application of the programming voltage to the memory cell based on the output of the current comparator.

4. The circuit of claim 1, wherein a voltage applied to the memory cell changes based on the application of the programming current to the memory cell, the circuit further comprising:
    a voltage comparator configured to (i) compare the voltage applied to the memory cell to a reference voltage, and (ii) generate an output based on the comparison, the output indicating whether the memory cell has been programmed.

5. The circuit of claim 4, wherein the circuitry is configured to terminate the application of the programming current to the memory cell based on the output of the voltage comparator.

6. The circuit of claim 1, further comprising:
    a first branch including the memory cell;
    a second branch including a current source, the current source being configured to generate a constant current; and
    a current mirror that couples the first branch to the second branch, the current mirror being configured to cause a current flow in the first branch to be copied to the second branch, and vice versa.

7. The circuit of claim 6, wherein a current flowing in the first branch changes based on the application of the programming voltage to the memory cell, the circuit further comprising:
    a current comparator configured to (i) compare the current flowing in the first branch to the constant current generated by the current source, and (ii) generate an output based on the comparison, the output indicating whether the memory cell has been programmed, wherein the current mirror copies the current flowing in the first branch to the second branch when the switch is in the first state, the second branch including the current comparator.

8. The circuit of claim 6, wherein the current mirror copies the constant current generated by the current source from the second branch to the first branch when the switch is in the second state, the constant current being the programming current that is applied to the memory cell when the switch is in the second state.

9. The circuit of claim 1, wherein the memory cell includes first and second terminals, the second terminal being electrically connected to a ground reference voltage, the circuit further comprising:
    an error amplifier having a first input, a second input, and a single-ended output, the first input being electrically connected to a first reference voltage that is equal to the programming voltage, and the second input being electrically connected to the switch;
    a first PMOS transistor having a source terminal electrically connected to a power supply voltage, a gate terminal electrically connected to the single-ended output of the error amplifier, and a drain terminal electrically connected to the first terminal of the memory cell;
    a voltage comparator having a first input configured to receive a second reference voltage and a second input electrically connected to the first terminal of the memory cell;
    a current source configured to generate a reference current that is equal to the programming current;
    a second PMOS transistor having a source terminal electrically connected to the power supply voltage, a gate terminal electrically connected to the single-ended output of the error amplifier, and a drain terminal electrically connected to the current source; and an inverter with an input electrically connected to the drain terminal of the second PMOS transistor, wherein when the switch is in the first state, the second input of the error amplifier is electrically connected to the first terminal of the memory cell, and wherein when the switch is in the second state, the second input of the error amplifier is electrically connected to the drain terminal of the second PMOS transistor.

10. The circuit of claim 9, wherein a voltage applied to the memory cell changes based on the application of the programming current to the memory cell, and wherein the voltage comparator is configured to (i) compare the voltage applied to the memory cell to the second reference voltage, and (ii) generate an output based on the comparison, the output indicating whether the memory cell has been programmed.

11. The circuit of claim 1, wherein the memory cell is a resistive random-access memory (RRAM) cell, a magneto-resistive random-access memory (MRAM) cell, or a phase change random-access memory (PCRAM) cell.

12. A circuit comprising:
a memory cell including a resistive switching element, the resistive switching element having a programmable resistance; and
circuitry coupled to the memory cell and including a switch, the circuitry being configured to apply a voltage to the memory cell when the switch is in a first state, and the circuitry being configured to apply a current to the memory cell when the switch is in a second state, the resistance of the resistive switching element changing from a first resistance state to a second resistance state based on the application of the voltage or the current to the memory cell.

13. The circuit of claim 12, further comprising:
a first branch including the memory cell;
a second branch including a current source, the current source being configured to generate the current;
a differential amplifier including first and second inputs, the first input being electrically connected to a first reference voltage that is equal to the voltage, and the second input being electrically connected to the memory cell when the switch is in the first state; and
a current mirror that couples the first branch to the second branch, the current mirror being configured to cause a current flow in the first branch to be copied to the second branch, and vice versa, wherein the current mirror copies the current generated by the current source from the second branch to the first branch when the switch is in the second state.

14. The circuit of claim 12, wherein a current flowing in the memory cell changes based on the application of the voltage to the memory cell, the circuit further comprising:
a current comparator configured to (i) compare the current flowing in the memory cell to a reference current, and (ii) generate an output based on the comparison, the output indicating whether the memory cell has been programmed.

15. The circuit of claim 14, wherein the reference current is equal to the current.

16. The circuit of claim 12, wherein a voltage applied to the memory cell changes based on the application of the current to the memory cell, the circuit further comprising:
a voltage comparator configured to (i) compare the voltage applied to the memory cell to a reference voltage, and (ii) generate an output based on the comparison, the output indicating whether the memory cell has been programmed.

17. The circuit of claim 16, wherein the reference voltage is not equal to the voltage.

18. The circuit of claim 12, further comprising:
a first branch including the memory cell;
a second branch including a current source, the current source being configured to generate the current; and
a current mirror that couples the first branch to the second branch, the current mirror being configured to cause a current flow in the first branch to be copied to the second branch, and vice versa.

19. The circuit of claim 12, wherein the memory cell includes first and second terminals, the second terminal being electrically connected to a ground reference voltage, the circuit further comprising:
an error amplifier having a first input, a second input, and a single-ended output, the first input being electrically connected to a first reference voltage that is equal to the voltage, and the second input being electrically connected to the switch;
a first PMOS transistor having a source terminal electrically connected to a power supply voltage, a gate terminal electrically connected to the single-ended output of the error amplifier, and a drain terminal electrically connected to the first terminal of the memory cell;
a voltage comparator having a first input configured to receive a second reference voltage and a second input electrically connected to the first terminal of the memory cell, the second reference voltage being different than the voltage;
a current source configured to generate a reference current that is equal to the current;
a second PMOS transistor having a source terminal electrically connected to the power supply voltage, a gate terminal electrically connected to the single-ended output of the error amplifier, and a drain terminal electrically connected to the current source; and
an inverter with an input electrically connected to the drain terminal of the second PMOS transistor, wherein when the switch is in the first state, the second input of the error amplifier is electrically connected to the first terminal of the memory cell, and wherein when the switch is in the second state, the second input of the error amplifier is electrically connected to the drain terminal of the second PMOS transistor.

20. A method of programming a memory cell having a programmable resistance, the method comprising:
applying a programming voltage to the memory cell using a circuit that is coupled to the memory cell, the circuit including a switch and being configured to apply the programming voltage to the memory cell when the switch is in a first state;
comparing a current flowing in the memory cell to a reference current when the switch is in the first state and generating a first output based on the comparison, the first output indicating whether the current flowing in the memory cell exceeds the reference current;
terminating the application of the programming voltage to the memory cell based on the first output indicating that the current flowing in the memory cell exceeds the reference current;
applying a programming current to the memory cell using the circuit, the circuit being configured to apply the programming current to the memory cell when the switch is in a second state;

comparing a voltage applied to the memory cell to a reference voltage when the switch is in the second state and generating a second output based on the comparison, the second output indicating whether the voltage applied to the memory cell is less than the reference voltage; and terminating the application of the programming current to the memory cell based on the second output indicating that the voltage applied to the memory cell is less than the reference voltage.

* * * * *